United States Patent
Rofougaran et al.

(10) Patent No.: US 8,135,367 B2
(45) Date of Patent: *Mar. 13, 2012

(54) METHOD AND SYSTEM FOR ON-DEMAND LINEARITY IN A RECEIVER

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 981 days.

This patent is subject to a terminal disclaimer.

(21) Appl. No.: 12/116,101

(22) Filed: May 6, 2008

(65) Prior Publication Data

US 2009/0280764 A1    Nov. 12, 2009

(51) Int. Cl.
H04B 1/06 (2006.01)
H04B 7/00 (2006.01)

(52) U.S. Cl. ............ 455/234.1; 455/266; 455/293; 455/343.1

(58) Field of Classification Search ............ 455/266, 455/339, 340, 280, 286, 293, 232.1, 234.1, 455/343.1
See application file for complete search history.

(56) References Cited

U.S. PATENT DOCUMENTS

| | | | |
|---|---|---|---|
| 6,670,901 B2 * | 12/2003 | Brueske et al. | 341/139 |
| 2003/0025623 A1 | 2/2003 | Brueske et al. | |
| 2003/0100279 A1 * | 5/2003 | Medvid et al. | 455/164.2 |
| 2004/0229590 A1 * | 11/2004 | Kubo et al. | 455/307 |
| 2005/0215219 A1 * | 9/2005 | Khorram | 455/226.1 |
| 2006/0035620 A1 * | 2/2006 | Millard et al. | 455/339 |
| 2006/0183456 A1 | 8/2006 | Minobe et al. | |
| 2007/0099591 A1 * | 5/2007 | Hendrix et al. | 455/343.1 |
| 2009/0023411 A1 * | 1/2009 | Katsube et al. | 455/307 |
| 2009/0042527 A1 | 2/2009 | Niknejad | |
| 2009/0154612 A1 | 6/2009 | Rofougaran | |

OTHER PUBLICATIONS

USPTO Office Action dated Sep. 15, 2010, U.S. Appl. No. 11/955,064, filed Dec. 12, 2007, Inventor: Ahmadreza Rofougaran.

* cited by examiner

Primary Examiner — Nguyen Vo
(74) Attorney, Agent, or Firm — Farjami & Farjami LLP

(57) ABSTRACT

Aspects of a method and system for on-demand linearity in a receiver are provided. In this regard, in a receiver such as on-chip receiver, a strength of a signal received by one or more antennas may be measured and linearity of the receiver may be controlled in response to the measured signal strength. The linearity may be controlled based on signal strength of in-band and/or out-of-band signals and by configuring component(s) of the receiver. Exemplary components may comprise one or more filter, amplifier, mixer, analog-to-digital converter, feedback loop, and equalizer and/or post corrector. Linearity may be increased, by switching one or more feedback loops and/or an equalizers and/or post correctors into a signal path of the receiver. Power consumption may be decreased, at the expense of reduced linearity, by switching one or more feedback loops and/or an equalizers and/or post correctors out of a signal path of the receiver.

22 Claims, 6 Drawing Sheets

METHOD AND SYSTEM FOR ON-DEMAND LINEARITY IN A RECEIVER

CROSS-REFERENCE TO RELATED APPLICATIONS/INCORPORATION BY REFERENCE

Not Applicable

FIELD OF THE INVENTION

Certain embodiments of the invention relate to signal processing. More specifically, certain embodiments of the invention relate to a method and system for on-demand linearity in a receiver.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Additionally, as the number of wireless devices and wireless communications standards increase, commonly used frequency bands are becoming increasingly congested with wireless traffic. In this regard, designing devices that can reliably operate in such noisy frequency bands is becoming increasingly difficult and costly. Accordingly, efforts exist to develop wireless technologies which operate at higher, less congested frequencies.

For example, in 2001, the Federal Communications Commission (FCC) designated a large contiguous block of 7 GHz bandwidth for communications in the 57 GHz to 64 GHz spectrum. This frequency band may be used by the spectrum users on an unlicensed basis, that is, the spectrum is accessible to anyone, subject to certain basic, technical restrictions such as maximum transmission power and certain coexistence mechanisms. The communications taking place in this band are often referred to as '60 GHz communications'. With respect to the accessibility of this part of the spectrum, 60 GHz communications is similar to other forms of unlicensed spectrum use, for example Wireless LANs or Bluetooth in the 2.4 GHz ISM bands. However, communications at 60 GHz may be significantly different in aspects other than accessibility. In this regard, there may be certain drawbacks associated with 60 GHz communications. For example, 60 GHz signals may provide markedly different communications channel and propagation characteristics. In this regard, 60 GHz radiation is partly absorbed by oxygen in the air. Accordingly, 60 GHz communications suffer from increased attenuation with distance as compared to, for example, 2.4 GHz. On the other hand, there may be advantages associated with 60 GHz communications. For example, since a very large bandwidth of 7 GHz is available, very high data rates may be achieved.

Shrinking features size of CMOS processes, for example, is one factor enabling development products and technologies for 60 GHz communications. However, even when fabricated on the smallest processes, conventional methods and circuit topologies are often unable to realize signal generation circuits which can generate signals sufficiently high in frequency to enable technologies such as 60 GHz communications.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for on-demand linearity in a receiver, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for on-demand linearity in a receiver. In this regard, in a receiver such as an on-chip receiver, a strength of a signal received by one or more antennas may be measured and linearity of the receiver may be controlled in response to the measured signal strength. The linearity may be controlled based on signal strength of in-band and/or out-of-band signals. Linearity may be controlled by configuring component(s) of the receiver. Exemplary components may comprise one or more exemplary components such as filters, amplifiers, mixers, analog-to-digital converters, feedback loops, and equalizers and/or post correctors. Linearity of the receiver may be increased, at the expense of increased power consumption, by switching one or more feedback loops and/or equalizers and/or post correctors into a signal path of the receiver. Power consumption of the receiver may be decreased, at the expense of reduced linearity, by switching one or more feedback loops and/or equalizers and/or post correctors out of a signal path of the receiver.

Figure 1A:
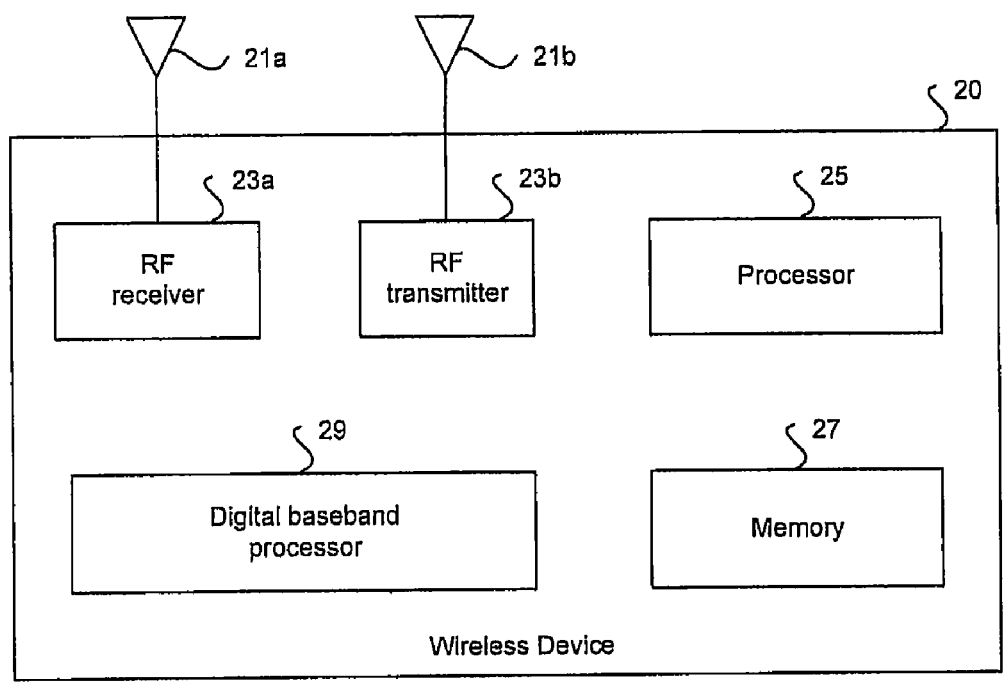
FIG. 1A is a block diagram illustrating an exemplary wireless device, in accordance with an embodiment of the invention.

FIG. 1A is a block diagram illustrating an exemplary wireless device, in accordance with an embodiment of the invention. Referring to FIG. 1A, there is shown a wireless device 20 that may comprise an RF receiver 23a, an RF transmitter 23b, a digital baseband processor 29, a processor 25, and a memory 27. A receive antenna 21a may be communicatively coupled to the RF receiver 23a. A transmit antenna 21b may be communicatively coupled to the RF transmitter 23b. The wireless device 20 may transmit and receive information utilizing high data rate, line-of-site communications operating at extremely high frequency (EHF) such as the ISM band centered at 61.25 GHz.

The RF receiver 23a may comprise suitable logic, circuitry, and/or code that may enable processing of received RF signals. The RF receiver 23a may enable receiving RF signals in a plurality of frequency bands. For example, the RF receiver 23a may enable receiving signals in extremely high frequency (e.g., 60 GHz) bands. Details of at least a portion of the receiver 23a may be as described below with respect to FIG. 1B. In this regard, the receiver 23a may be enabled to receive, filter, amplify, down-convert, and/or perform analog to digital conversion. Moreover, linearity of the receiver 23a may be dynamically controlled, and thus power efficiency of the receiver 23a may be improved over conventional receivers. In various embodiments of the invention, the wireless device 20 may comprise a plurality of the receivers 23a and may thus support multiple frequency bands and or simultaneous reception of signals in the same frequency band. In various embodiments of the invention, the RF receiver 23a may down convert a received RF signal to baseband or to an intermediate frequency (IF). Additionally, the receiver 23a may perform quadrature down-conversion where in-phase components and quadrature phase components may be processed in parallel. In various embodiments of the invention, the RF receiver 23a may be integrated on a semiconductor substrate and may, for example, be referred to as a "system on chip".

The digital baseband processor 29 may comprise suitable logic, circuitry, and/or code that may enable processing and/or handling of baseband signals. In this regard, the digital baseband processor 29 may process or handle signals received from the RF receiver 23a and/or signals to be transferred to the RF transmitter 23b, when the RF transmitter 23b is present, for transmission to the network. The digital baseband processor 29 may also provide control and/or feedback information to the RF receiver 23a and to the RF transmitter 23b based on information from the processed signals. In this regard, the baseband processor 29 may provide a control signal to one or more of SSI 104, the LNA 110, the mixer 112, the filter 114 (and possibly 106 and 108), and/or the ADC 116. The digital baseband processor 29 may communicate information and/or data from the processed signals to the processor 25 and/or to the memory 27. Moreover, the digital baseband processor 29 may receive information from the processor 25 and/or to the memory 27, which may be processed and transferred to the RF transmitter 23b for transmission to the network.

The RF transmitter 23b may comprise suitable logic, circuitry, and/or code that may enable processing of RF signals for transmission. The RF transmitter 23b may enable transmission of RF signals in a plurality of frequency bands. For example, the RF transmitter 23b may enable transmitting signals in extremely high frequency (EHF) bands such as the ISM centered at 61.25 GHz. Each frequency band supported by the RF transmitter 23b may have a corresponding front-end circuit for handling amplification and up conversion operations, for example. In this regard, the RF transmitter 23b may be referred to as a multi-band transmitter when it supports more than one frequency band. In another embodiment of the invention, the wireless device 20 may comprise more than one RF transmitter 23b, wherein each of the RF transmitters 23b may be a single-band or a multi-band transmitter. In various embodiments of the invention, the RF transmitter 23b may perform direct up conversion of the baseband signal to an RF signal. In some instances, the RF transmitter 23b may enable digital-to-analog conversion of the baseband signal components received from the digital baseband processor 29 before up conversion. In other instances, the RF transmitter 23b may receive baseband signal components in analog form. In various embodiments of the invention, the RF transmitter 23b may be integrated on a semiconductor substrate and may, for example, be referred to as a "system on chip".

The processor 25 may comprise suitable logic, circuitry, and/or code that may enable control and/or data processing operations for the wireless device 20. The processor 25 may be utilized to control at least a portion of the RF receiver 23a, the RF transmitter 23b, the digital baseband processor 29, and/or the memory 27. In this regard, the processor 25 may generate at least one signal for controlling operations within the wireless device 20. In this regard, the processor 25 may provide a control signal to one or more of SSI 104, the LNA 110, the mixer 112, the filter 114 (and possibly 106 and 108), and/or the ADC 116. The processor 25 may also enable executing of applications that may be utilized by the wireless device 20. For example, the processor 25 may execute applications that may enable displaying and/or interacting with content received via EHF communications.

The memory 27 may comprise suitable logic, circuitry, and/or code that may enable storage of data and/or other information utilized by the wireless device 20. For example, the memory 27 may be utilized for storing processed data generated by the digital baseband processor 29 and/or the processor 25. The memory 27 may also be utilized to store information, such as configuration information, that may be utilized to control the operation of at least one block in the wireless device 20. For example, the memory 27 may comprise information necessary to configure the RF receiver 23a to enable receiving signals at various signal levels and in the presence of varying amounts of interference. In this regard, the memory may store control and/or configuration information for one or more of the SSI 104, the LNA 110, the mixer 112, the filter 114 (and possibly 106 and 108), and/or the ADC 116.

Figure 1B:
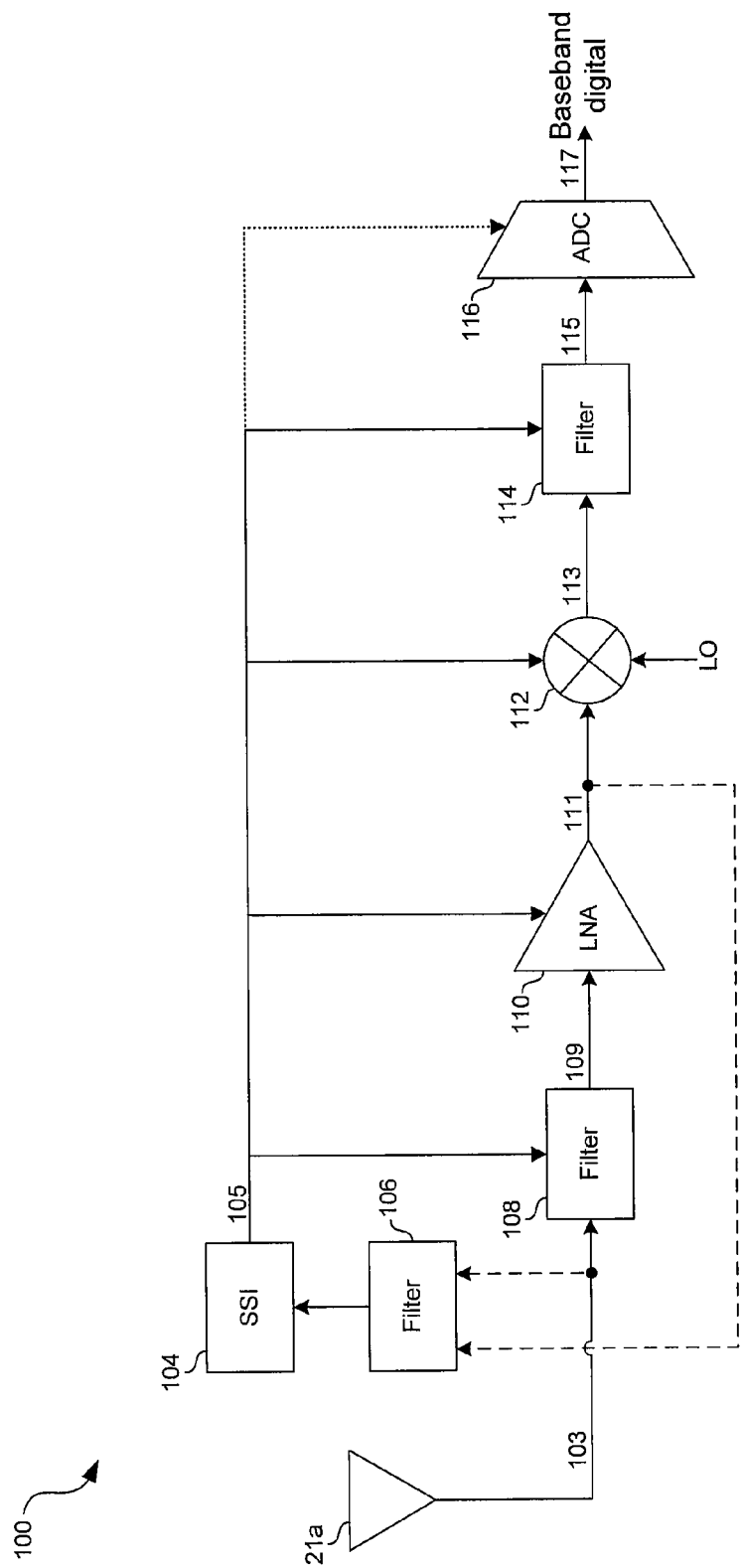
FIG. 1B is a block diagram of a portion of an exemplary receiver with on-demand linearity, in accordance with an embodiment of the invention.

FIG. 1B is a block diagram of a portion of an exemplary receiver with on-demand linearity, in accordance with an embodiment of the invention. Referring to FIG. 1B the receiver 23a may comprise a signal strength indicator (SSI) 104, filters 106, 108, and 114, low noise amplifier (LNA) 110, mixer 112, and analog-to-digital converter (ADC) 116. In various embodiments of the invention, the components of the receiver 23a may reside on a common substrate, such as a silicon die. In this regard, the receiver 23a may be referred to as a system on chip.

The SSI 104 may comprise suitable logic, circuitry, and/or code that may enable determining signal strength. In this regard, the SSI 104 may, for example, be enabled to measure current, voltage and/or power of the signal 103 and/or 111. Additionally, the SSI 104 may be enabled to generate one or more control signals 105, which, in various embodiments of the invention, may be coupled to one or more of the filters 106, 108, and 114, the LNA 110, the mixer 112, and the analog-to-digital converter (ADC) 116. In various embodiments of the invention, the signal 105 may be a digital and/or analog signal representation of the current, voltage, and/or power of the signal 103 and/or 111.

The filter 106 may comprise suitable logic, circuitry, and/or code for attenuating undesired frequencies to a greater extent than desired frequencies. In this regard, the filter 106 may have, for example, a bandpass frequency response. The filter 108 may be tunable such that a bandwidth and/or center frequency characterizing the frequency response of the filter may be adjustable. In this manner, the filter 106 may be controlled such that the SSI 104 may perform measurements of desired frequencies, bandwidths, etc.

The filter 108 may comprise suitable logic, circuitry, and/or code for attenuating undesired frequencies to a greater extent than desired frequencies. In this regard, the filter 106 may have, for example, a bandpass frequency response. The filter 108 may be configurable such that a bandwidth, a center frequency, and/or a passband and/or stopband response (e.g., Butterworth, Chebyshev, Cauer, Bessel) of the filter 108 may be adjusted. In this manner, the filter 108 may enable tuning the receiver 23a to a desired frequency (e.g. 60 GHz) and attenuating interference and/or noise present in the channel. Moreover, configuring the filter 108 may involve a trade-off between linearity and power consumption. For example, switching additional components and/or stages into the filter 108 may increase the linearity of the filter 108, but the additional components and/or stages may consume additional power. Conversely, switching components and/or stages out of the filter 108 may reduce the power consumption of the filter 108 but also degrade the linearity of the filter 108.

The filter 114 may comprise suitable logic, circuitry, and/or code for attenuating undesired frequencies to a greater extent than desired frequencies. In this regard, the filter 114 may have, for example, a bandpass frequency response. The filter 114 may be configurable such that a bandwidth, a center frequency, and/or a passband and/or stopband response (e.g., Butterworth, Chebyshev, Cauer, Bessel) of the filter 114 may be configured. In this manner, the filter 114 may be enabled to reject undesired inter-modulation products output by the mixer 112 while passing desired inter-modulation products. Moreover, configuring the filter 114 may involve a trade-off between linearity and power consumption. For example, switching additional components and/or stages into the filter 114 may increase the linearity of the filter 114, but the additional components and/or stages may consume additional power. Conversely, switching components and/or stages out of the filter 114 may reduce the power consumption of the filter 114 but also degrade the linearity of the filter 114.

The mixer 112 may comprise suitable logic, circuitry, and/or code that may enable generation of inter-modulation products resulting from the mixing of a received RF signal and a local oscillator (LO). The frequency of the LO signal may be determined based on the desired frequency/channel to be received. In this regard, the mixer 112 may enable downconverting, for example, RF signals of a range of frequencies to a fixed intermediate frequency (IF) or directly to baseband. The mixer 112 may be configurable based on one or more characteristics of the input signal 111 and/or the output signal 113 such as a strength of the desired frequency and/or out-of-band frequencies. Moreover, configuring the mixer 112 may involve a trade-off between linearity and power consumption. For example, switching additional components into a signal path of the mixer 112 and/or adjusting a voltage and/or a current supplied to the mixer 112 may increase the linearity of the mixer 112, but may also increase the power consumption of the mixer 112. Conversely, switching components out of a signal path of the mixer 112 and/or adjusting a voltage and/or a current supplied to the mixer 112 may decrease the power consumption of the mixer 112 but may also degrade the linearity of the mixer 112.

The LNA 110 may comprise suitable logic, circuitry, and/or code that may enable buffering and/or amplification of received RF signals. In this regard, the gain of the LNA 110 may be adjustable to enable reception of signals of varying strength. Accordingly, the output 111 of the LNA 110 may be measured, for example by the SSI 104, and the gain of the LNA 110 may be adjusted to maintain the signal 111 within determined limits. Additionally, the linearity of the LNA 110 may be configurable. In this regard, configuring the LNA 110 may involve a trade-off between linearity and power consumption. For example, switching additional components into a signal path of the LNA 110 and/or adjusting a voltage and/or a current supplied to the LNA 110 may increase the linearity of the LNA 110, but may also increase the power consumption of the LNA 110. Conversely, switching components out a signal path of the LNA 110 and/or adjusting a voltage and/or a current supplied to the LNA 110 may decrease the power consumption of the LNA 110 but may also degrade the linearity of the mixer 112.

The ADC 116 may comprise suitable logic, circuitry, and/or code that may enable conversion of analog signals to a digital representation. In this regard, the ADC 116 may, for example, sample and quantize analog signal 115 at times specified by a sample clock. Accordingly, the ADC 116 may receive one or more control signals from, for example, a processor and/or a clock generator. Additionally, the linearity of the ADC 116 may be configurable. In this regard, configuring the ADC 116 may involve a trade-off between linearity and power consumption. For example, switching additional components into a signal path of the ADC 116 and/or adjusting a voltage and/or a current supplied to the ADC 116 may increase the linearity of the ADC 116, but may also increase the power consumption of the ADC 116. Conversely, switching components out of a signal path the ADC 116 and/or adjusting a voltage and/or current supplied to the ADC 116 may decrease the power consumption of the ADC 116 but may also degrade the linearity of the ADC 116.

In operation, an RF signal received by the antenna 21a and/or the LNA output 111 may be measured to determine signal strength of in-band and/or out-of-band signals. In this regard, in-band may refer to signals within a passband of the filter 108 while out-of-band signals may fall in a stopband of the filter 108. The filter 106 may be adjusted and/or tuned and measurements may be taken at various frequencies and/or bandwidths in order to determine the in-band and/or out-of-band signal strengths. Alternatively, the SSI 104 may be enabled to determine other characteristics, such as signal to noise ratio (SNR), and dynamic range, of the received signal by, for example, performing a fast Fourier transform analysis of the signal 103 and/or 111.

Signal strength measurements may be performed and utilized real-time to control the linearity of the LNA 110, the mixer 112, the filters 114 (and possibly 106 ad 108), and the ADC 116. In this regard, the receiver 23a may be configured to balance linearity and power consumption of the receiver 23a such that power may be conserved when reduced linearity may be tolerated.

Figure 1C:
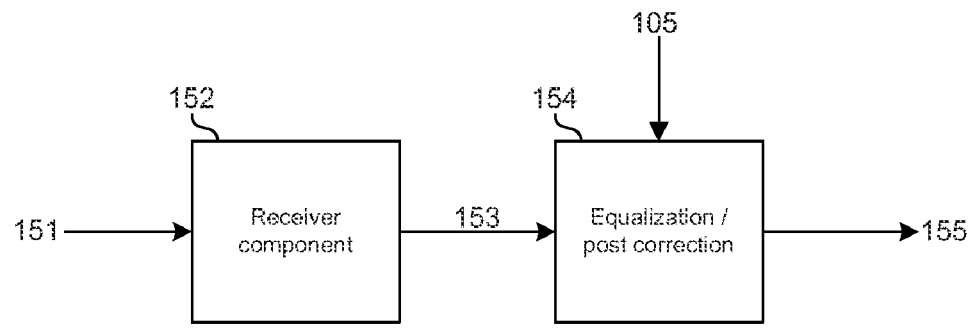
FIGS. 1C-1D illustrate controlling linearity in a receiver via configurable post correction, in accordance with an embodiment of the invention.
Figure 1D:
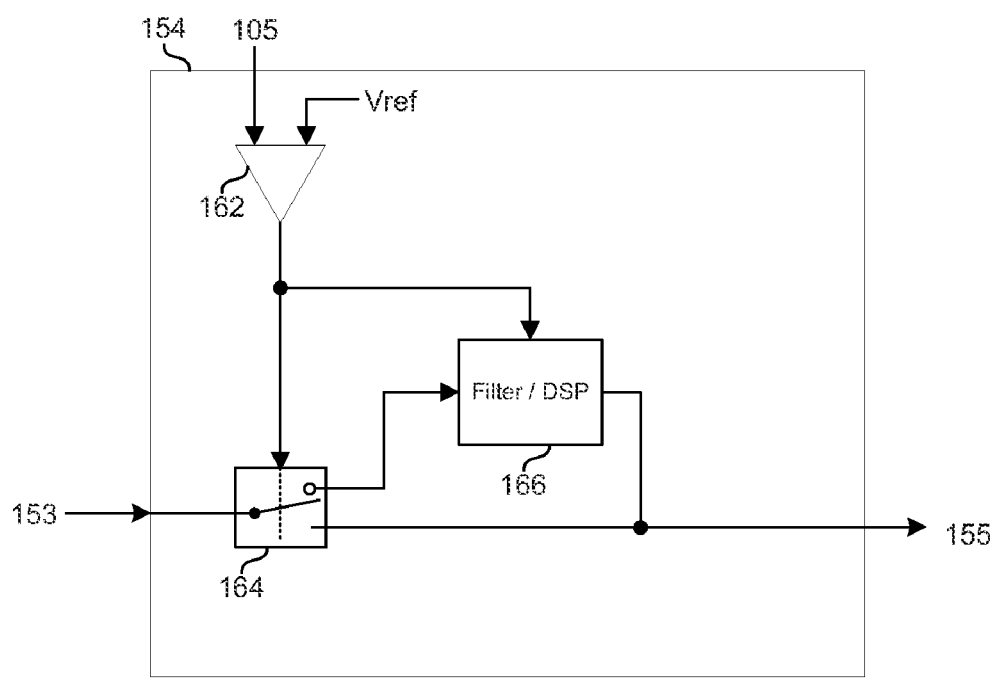

FIGS. 1B-1C illustrate controlling linearity in a receiver via configurable post correction, in accordance with an embodiment of the invention. Referring to FIG. 1C there is shown a receiver component 152 and an equalizer/post corrector block 154.

The receiver component 154 may be similar to or the same as the LNA 110, the mixer 112, the filters 114 (and possibly 106 ad 108), or the ADC 116. In this regard, the receiver component 154 may be a generalized component for illustration purposes.

The equalizer and/or post corrector 154 may comprise suitable logic, circuitry, and/or code that may enable processing the output of the receiver component 152 such that the combined response of the receiver component 152 cascaded with the equalizer and/or post corrector 154 may be more linear than the response of the receiver component 152 alone. In this regard, the response of equalizer and/or post corrector 154 may be an inverse function of the response of the receiver component 152. For example, the receiver component 152 may be characterized by a relationship of $I_{153}=f(V_{151})$ and the equalizer and/or post corrector 154 may be characterized by the relationship $V_{155}=f^{-1}(I_{153})$. In this manner, the equalizer and/or post corrector 154 may compensate for nonlinearity in the receiver component 152.

In operation, the linearity of the receiver component 152 and thus the receiver 23a may be adjusted based on the signal 205 generated by the SSI 104 described with respect to FIG. 1. For example, as depicted in FIG. 1D, the signal 105 may be compared to a reference voltage via the comparator 162 and in instances that the signal 105 may be less than the reference voltage, a filter and/or digital signal processing (DSP) block 166 may be switched into the signal path by the switch 164. Conversely, in instances that the signal 105 may be greater than the reference voltage, the switch 164 may bypass the filter and/or DSP block 166. In this regard, in instances that reduced linearity may be tolerated, the filter and/or DSP block 166 may be powered down, thus reducing power consumption. In this manner, the receiver component 152 may be configured real-time in response to signal measurements.

Figure 1E:
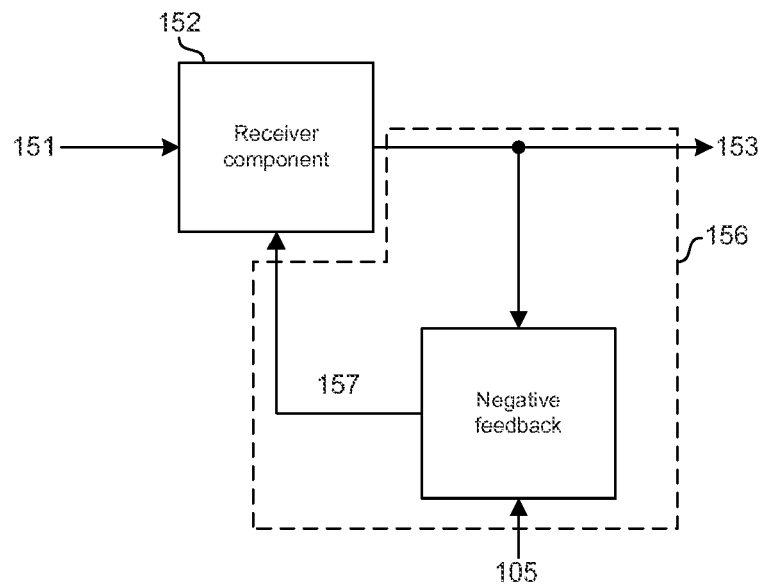
FIGS. 1E-1F illustrate controlling linearity in a receiver via configurable feedback, in accordance with an embodiment of the invention.
Figure 1F:
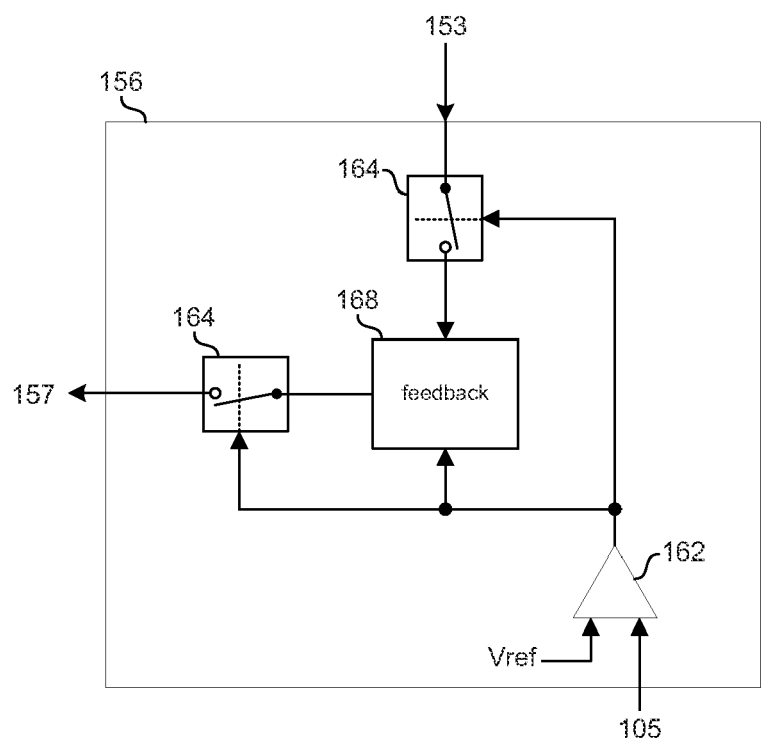

FIG. 1E-1F illustrate controlling linearity in a receiver via configurable feedback, in accordance with an embodiment of the invention. Referring to FIG. 1E there is shown a receiver component 152 and a feedback loop 156.

The receiver component 154 may be similar to or the same as the LNA 110, the mixer 112, the filters 114 (and possibly 106 and 108), or the ADC 116. In this regard, the receiver component 154 may be a generalized component for illustration purposes.

The feedback loop 156 may comprise suitable logic, circuitry, and/or code that may enable generating a feedback signal 157 based on the signal 153 output by the receiver component 154. In this regard, negative feedback may be applied to, for example, an input and/or one or more bias points of the receiver component 152. Consequently, voltages and/or currents in the receiver component 152 may be more stable, and thus more linear, over a wider range of signal levels and/or signal frequencies.

In operation, the linearity of the receiver component 152, and thus the receiver 23a, may be adjusted, real-time, based on the signal 205 generated by the SSI 104 described with respect to FIG. 1B. For example, as depicted in FIG. 1F, the signal 105 may be compared to a reference voltage via the comparator 162 and in instances that the signal 105 may be greater than the reference voltage, the feedback loop 156 may be switched into the signal path via the switches 164. Conversely, in instances that the signal 105 may be less than the reference voltage, the feedback loop 156 may be switched out of the signal path via the switches 164. In this regard, in instances that reduced linearity may be tolerated the feedback block 168 may be powered down, thus reducing power consumption.

Figure 2:
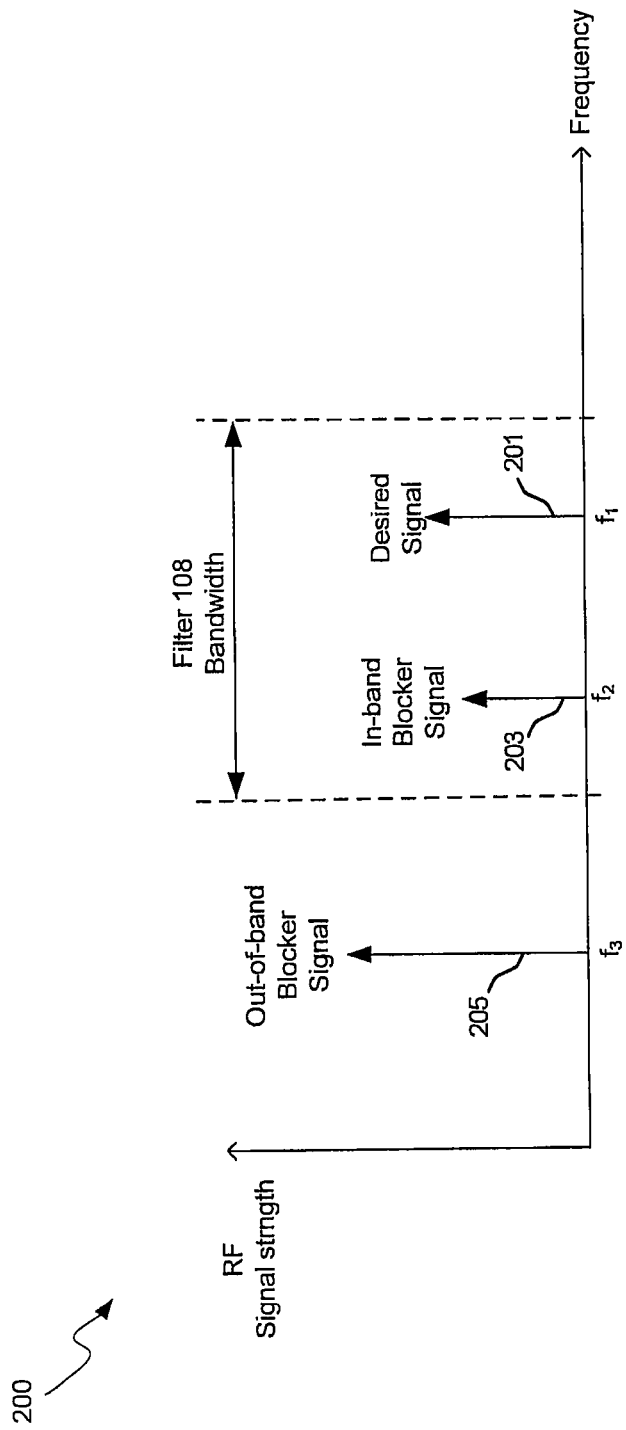
FIG. 2 is a diagram illustrating an exemplary frequency spectrum of signals arriving at a receiver with on-demand linearity, in accordance with an embodiment of the invention.

FIG. 2 is a diagram illustrating an exemplary frequency spectrum of signals arriving at a receiver with on-demand linearity, in accordance with an embodiment of the invention. Referring to FIG. 2, there is shown a signal 200 comprising desired signal component 201, in-band blocker (interference) signal component 203, and out-of-band blocker (interference) signal component 205. Accordingly, the SSI 104 may be enabled to measure the strength of the signal components 201, 203, and/or 205 and adjust linearity of the receiver 23a accordingly. In an exemplary embodiment of the invention, the signal component 201 may be a desired channel, the signal component 205 may be an adjacent channel, and the signal component 203 may be interference from, for example, a different technology or wireless standard.

Figure 3:
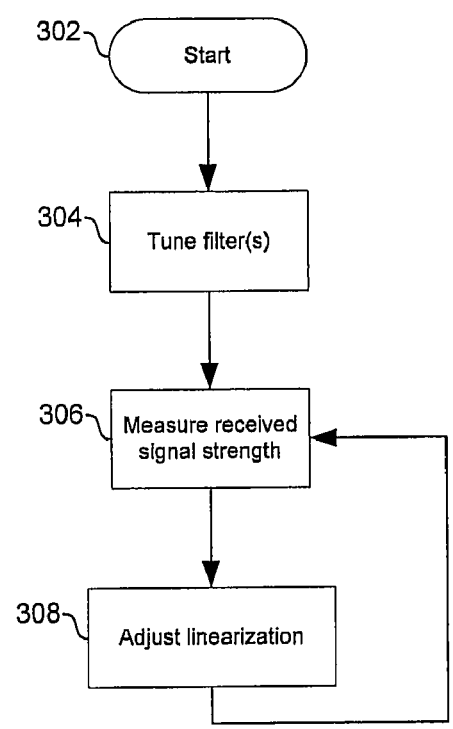
FIG. 3 is a flow chart illustrating exemplary steps for on-demand receiver linearity, in accordance with an embodiment of the invention.

FIG. 3 is a flow chart illustrating exemplary steps for on-demand receiver linearity, in accordance with an embodiment of the invention. Referring to FIG. 3 the exemplary steps may begin with start step 302 when signals may be received by the antenna 21a. Subsequent to step 302, the exemplary steps may advance to step 304. In step 304, the filter 106, 108, and/or 114 may be tuned. In this regard, the filter 108 may be tuned to a desired channel for reception and processing by receiver 23a. In this manner, a passband of the filter 108 may be referred to herein as "in-band". Additionally, the filter 106 may be tuned to control which frequencies may be measured. For example, the filter 106 may sweep one or more frequency bands to characterize the environment in which the receiver 23a may be operating. Also, the filter 114 may be tuned to select a desired inter-modulation product from the mixer 112 and reject undesired inter-modulation products generated by the mixer 112. Subsequent to step 304, the exemplary steps may advance to step 306.

In step 306, the SSI 104 may provide a measure of the signal strength of the signal 103 and/or 111. Accordingly, the signal 105 generated by the SSI 104 may be based, at least in part, on the results of the measurement of the signal 103 and/or 111. For example, the signal 105 may be a DC voltage which may control a configuration of one or more components of the receiver 23a to balance linearity and power consumption of the receiver 23a. In another embodiment of the invention, the signal 105 may be a periodic signal and a characteristic such as phase, frequency, duty cycle, etc. of the signal 105 may, at least in part, control a configuration of one or more components of the receiver 23a to manage linearity and power consumption of the receiver 23a. Subsequent to step 306, the exemplary steps may advance to the step 308.

In step 308, a configuration of the LNA 110, the mixer 112, the filter 114 (and possibly filters 106 and 108), the ADC 116, and/or one or more other components, such as a feedback or equalizer and/or post corrector, coupled thereto may be adjusted via the signal 105. Subsequent to step 308, the exemplary steps may return to step 306. In this regard, the process of monitoring signal levels and configuring the receiver 23a to control linearity and/or power consumption may be based on periodic or continuous feedback to improve efficiency of the receiver 23a.

Aspects of a method and system for on-demand receiver linearity are provided. In an on-chip receiver such as receiver 23a communicatively coupled to one or more antennas, a signal strength of a signal received by one or more antennas may be measured. In response to the measurement, a linearity of the on-chip receiver may be controlled by configuring one or more components within the on-chip receiver based on the measured signal strength and based on power consumption with said on-chip receiver. In this regard, a strength of a signal received by the antenna 21a may be measured and linearity of the receiver 23a may be controlled based on the measured signal strength. The linearity of the receiver 23a may be controlled based on signal strength of in-band signals, such as the signals 201 and 203, and/or out-of-band signals such as the signal 205. Linearity of the receiver 23a may be controlled by configuring one or more components of the receiver. Exemplary components of the receiver may comprise the filters 106, 106, and 114; amplifier 110; mixer 112; analog-to-digital converter 116; feedback loop 156 and equalizer and/or post corrector 154. Linearity of the receiver 23a may be increased, at the expense of increased power consumption, by switching one or more feedback loops 156 and/or an equalizers and/or post correctors 154 into a signal path of the receiver 23a. Power consumption in the receiver 23a may be decreased, at the expense of reduced linearity, by switching one or more feedback loops 156 and/or an equalizers and/or post correctors 154 out of a signal path of the receiver. The measuring and/or the controlling may occur dynamically and/or in real-time.

Another embodiment of the invention may provide a machine-readable storage, having stored thereon, a computer program having at least one code section executable by a machine, thereby causing the machine to perform the steps as described herein for on-demand linearity in a receiver.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
measuring a signal strength of a signal, said signal received by an on-chip receiver via one or more antennas; and
responsive to said measurement, controlling a linearity of said on-chip receiver by configuring one or more components within said on-chip receiver based on said measured signal strength and based on power consumption of said on-chip receiver, wherein:
said one or more components comprise one or more feedback loops; and
said controlling comprises one or both of:
increasing said linearity of said on-chip receiver by switching said one or more feedback loops into a signal path of said on-chip receiver; and
decreasing power consumption in said on-chip receiver by switching said one or more feedback loops out of a signal path of said on-chip receiver.

2. The method according to claim 1, comprising controlling said linearity based on measured signal strength of at least one in-band signal component.

3. The method according to claim 1, comprising controlling said linearity based on measured signal strength of at least one out-of-band signal component.

4. The method according to claim 1, wherein said one or more components comprise one or more of a filter, an amplifier, a mixer, and an analog-to-digital converter.

5. The method according to claim 1, wherein said one or components comprise one or more equalizers and/or post correctors.

6. The method according to claim 5, comprising increasing said linearity of said on-chip receiver by switching said one or more equalizers and/or post correctors into a signal path of said on-chip receiver.

7. The method according to claim 5, comprising decreasing power consumption in said on-chip receiver by switching said one or more equalizers and/or post correctors out of a signal path of said on-chip receiver.

8. The method according to claim 1, comprising enabling and/or disabling one or more portions of said one or more components in said on-chip receiver based on said measured signal strength.

9. The method according to claim 1, comprising controlling a power supplied to one or more portions of said one or more components in said on-chip receiver based on said measured signal strength.

10. The method according to claim 1, wherein said signal received by said one or more antennas are of a frequency at or near the industrial scientific and medical band centered at 61.25 GHz.

11. The method according to claim 1, wherein said measuring and/or said controlling occur real-time.

12. A system for signal processing, the system comprising:
one or more circuits operable to:
measure a signal strength of a signal, said signal received by an on-chip receiver via one or more antennas; and
responsive to said measurement, control a linearity of said on-chip receiver by configuring one or more components within said on-chip receiver based on said measured signal strength and based on power consumption of said on-chip receiver, wherein:
said one or more components comprise one or more feedback loops; and
said controlling comprises one or both of:
increasing said linearity of said on-chip receiver by switching said one or more feedback loops into a signal path of said on-chip receiver; and decreasing power consumption in said on-chip receiver by switching said one or more feedback loops out of a signal path of said on-chip receiver.

13. The system according to claim 12, wherein said one or more circuits are operable to control said linearity based on measured signal strength of at least one in-band signal component.

14. The system according to claim 12, wherein said one or more circuits are operable to control said linearity based on measured signal strength of at least one out-of-band signal component.

15. The system according to claim 12, wherein said one or more components comprise one or more of a filter, an amplifier, a mixer, an analog-to-digital converter.

16. The system according to claim 12, wherein said one or components comprise one or more equalizers and/or post correctors.

17. The system according to claim 16, wherein said one or more circuits are operable to increase said linearity of said on-chip receiver by switching said one or more equalizers or post correctors into a signal path of said on-chip receiver.

18. The system according to claim 16, wherein said one or more circuits are operable to decrease power consumption in said on-chip receiver by switching said one or more equalizers or post correctors out of a signal path of said on-chip receiver.

19. The system according to claim 12, wherein said one or more circuits are operable to enable and/or disable one or more portions of said one or more components in said on-chip receiver based on said measured signal strength.

20. The system according to claim 12, wherein said one or more circuits are operable to control a power supplied to one or more portions of said one or more components in said on-chip receiver based on said measured signal strength.

21. The system according to claim 12, wherein said signal received by said one or more antennas are of a frequency at or near the industrial scientific and medical band centered at 61.25 GHz.

22. The system according to claim 12, wherein said measuring and/or said controlling occur real-time.

* * * * *